United States Patent
Chen et al.

(10) Patent No.: US 7,176,104 B1
(45) Date of Patent: Feb. 13, 2007

(54) METHOD FOR FORMING SHALLOW TRENCH ISOLATION STRUCTURE WITH DEEP OXIDE REGION

(75) Inventors: Chih-Hsiang Chen, Portland, OR (US); Guo-Qiang Lo, Portland, OR (US)

(73) Assignee: Integrated Device Technology, Inc., San Jose, CA (US)

( * ) Notice: Subject to any disclaimer, the term of this patent is extended or adjusted under 35 U.S.C. 154(b) by 113 days.

(21) Appl. No.: 10/863,540

(22) Filed: Jun. 8, 2004

(51) Int. Cl.
H01L 21/76 (2006.01)
H01L 21/336 (2006.01)

(52) U.S. Cl. ............... 438/424; 438/294; 438/295; 438/296

(58) Field of Classification Search ........ 438/294–296, 438/424, 435
See application file for complete search history.

(56) References Cited

U.S. PATENT DOCUMENTS

| | | | |
|---|---|---|---|
| 4,563,227 A | 1/1986 | Sakai | |
| 4,663,832 A | 5/1987 | Jambotkar | |
| 4,871,685 A | 10/1989 | Taka | |
| 4,916,086 A | 4/1990 | Takahashi | |
| 4,923,821 A | 5/1990 | Namose | |
| 4,931,409 A | 6/1990 | Nakajima | |
| 4,992,390 A * | 2/1991 | Chang | 438/270 |
| 5,084,408 A | 1/1992 | Baba | |
| 5,258,332 A | 11/1993 | Horioka | |
| 5,350,941 A | 9/1994 | Madan | |
| 5,433,794 A | 7/1995 | Fazan et al. | |
| 5,521,422 A | 5/1996 | Mandelman | |
| 5,567,270 A | 10/1996 | Liu | |
| 5,578,518 A | 11/1996 | Koike et al. | |
| 5,807,784 A * | 9/1998 | Kim | 438/423 |
| 5,811,347 A * | 9/1998 | Gardner et al. | 438/435 |
| 6,228,720 B1 * | 5/2001 | Kitabatake et al. | 438/268 |
| 6,238,998 B1 * | 5/2001 | Leobandung | 438/404 |
| 6,255,717 B1 | 7/2001 | Babcock et al. | |
| 6,258,676 B1 | 7/2001 | Lee et al. | |
| 6,333,232 B1 * | 12/2001 | Kunikiyo | 438/296 |
| 6,444,528 B1 * | 9/2002 | Murphy | 438/270 |
| 6,514,833 B1 * | 2/2003 | Ishida et al. | 438/424 |

(Continued)

OTHER PUBLICATIONS

Planarization and Integration of Shallow Trench Isolation, Pan et al., 1999 VMIC, Santa Clara, CA, Jun. 1998.

*Primary Examiner*—Luan Thai
(74) *Attorney, Agent, or Firm*—Kenneth Glass; Glass & Associates

(57) ABSTRACT

The present invention relates to a shallow trench isolation structure and a method for forming a shallow trench isolation structure on a semiconductor substrate. A masking structure that includes a hard mask is formed over the semiconductor substrate and an etch is performed so as to form trenches within the semiconductor substrate. A shallow trench isolation structure and a method for forming a shallow trench isolation structure are disclosed. Oxidation enhancing species are then implanted into the bottom surface of the trenches and an oxidation process is performed. The oxidation enhancing species will form a deep oxidation region below the bottom surface of each trench and will form thinner oxidation regions within side surfaces of trenches. A layer of dielectric material is then deposited to fill the trenches. A chemical mechanical polishing process is performed to remove those portions of the dielectric film that overlie the hard mask. The hard mask is then removed, producing a void-free shallow trench isolation structure.

15 Claims, 16 Drawing Sheets

U.S. PATENT DOCUMENTS

| | | |
|---|---|---|
| 6,541,350 B2 * | 4/2003 | Chen .......................... 438/424 |
| 6,541,382 B1 | 4/2003 | Cheng et al. |
| 6,576,558 B1 * | 6/2003 | Lin et al. .................... 438/700 |
| 6,645,867 B2 | 11/2003 | Dokumaci et al. |
| 6,645,868 B1 | 11/2003 | Babcock et al. |
| 6,680,239 B1 * | 1/2004 | Cha et al. ................... 438/435 |
| 6,689,665 B1 | 2/2004 | Jang et al. |
| 6,921,699 B2 * | 7/2005 | Ma et al. .................... 438/270 |
| 7,012,005 B2 * | 3/2006 | Lichtenberger et al. ..... 438/270 |

* cited by examiner

US 7,176,104 B1

METHOD FOR FORMING SHALLOW TRENCH ISOLATION STRUCTURE WITH DEEP OXIDE REGION

FIELD OF THE INVENTION

The present invention relates to the field of semiconductor devices. More specifically, the present invention relates to semiconductor device shallow trench isolation structures and methods for forming shallow trench isolation structures.

BACKGROUND ART

Shallow trench isolation structures are used in semiconductor device fabrication to isolate active areas of the semiconductor substrate. Typically, shallow trench isolation structures are formed by etching the top surface of the semiconductor substrate so as to form trenches that extend into the semiconductor substrate. These trenches surround areas of the semiconductor substrate that are commonly referred to as "active areas."

Semiconductor fabrication processes typically require that adjoining devices within the semiconductor substrate be electrically isolated to a particular depth within the substrate, referred to as "isolation depth." Isolation depth is the minimum depth at which adjoining active regions must be separated in order to prevent current leakage in excess of design specifications for a particular product. In conventional semiconductor fabrication processes trenches are etched to a depth that is equal to or that is slightly greater than the isolation depth. A layer of oxide is then deposited such that it fills the trenches. A chemical mechanical polishing process is performed, forming a dielectric plug that fills the trenches so as to isolate adjoining active areas.

The trenches of conventional shallow trench isolation structures have sufficient width such that they are relatively easy to fill with oxide. However, as device sizes decrease, isolation depth must be maintained while using trenches that are narrower. When these narrower trenches are filled with oxide, voids can form in the dielectric. These voids can result in poly bridging during subsequent process steps. More particularly, when the chemical mechanical polishing process opens up a void, poly-gate film can fill the void. The patterning process may not remove the poly-gate film within the void, creating undesired regions of polysilicon that can extend between adjoining lines and structures, causing current leakage.

Accordingly there is a need for a shallow trench isolation structure and a method for forming a shallow trench isolation structure that allows for the formation of narrow trenches that meet isolation depth requirements. Also, there is a need for a shallow trench isolation structure and a method for forming a shallow trench isolation structure that meet the above requirements, and that will not result in the formation of voids within the dielectric layer. The present invention meets the above needs.

DISCLOSURE OF THE INVENTION

A shallow trench isolation structure and a method for forming a shallow trench isolation structure are disclosed. First, trenches are formed that extend within the semiconductor substrate. Oxidation enhancing species are then implanted into the bottom surface of the trenches and an oxidation process is performed. The oxidation enhancing species will form a deep oxidation region below the bottom surface of each trench and will form thinner oxidation regions within side surfaces of trenches. A layer of dielectric material is then deposited to fill the trenches.

The methods of the present invention allow for the use of shallower trenches than prior art processes for obtaining a particular isolation depth. This allows for the formation of narrower trenches while eliminating the problems of void formation that can occur in conventional prior art processes having narrow trenches.

These and other advantages of the present invention will no doubt become obvious to those of ordinary skill in the art after having read the following detailed description of the preferred embodiments, which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

The drawings referred to in this description should be understood as not being drawn to scale except if specifically noted.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
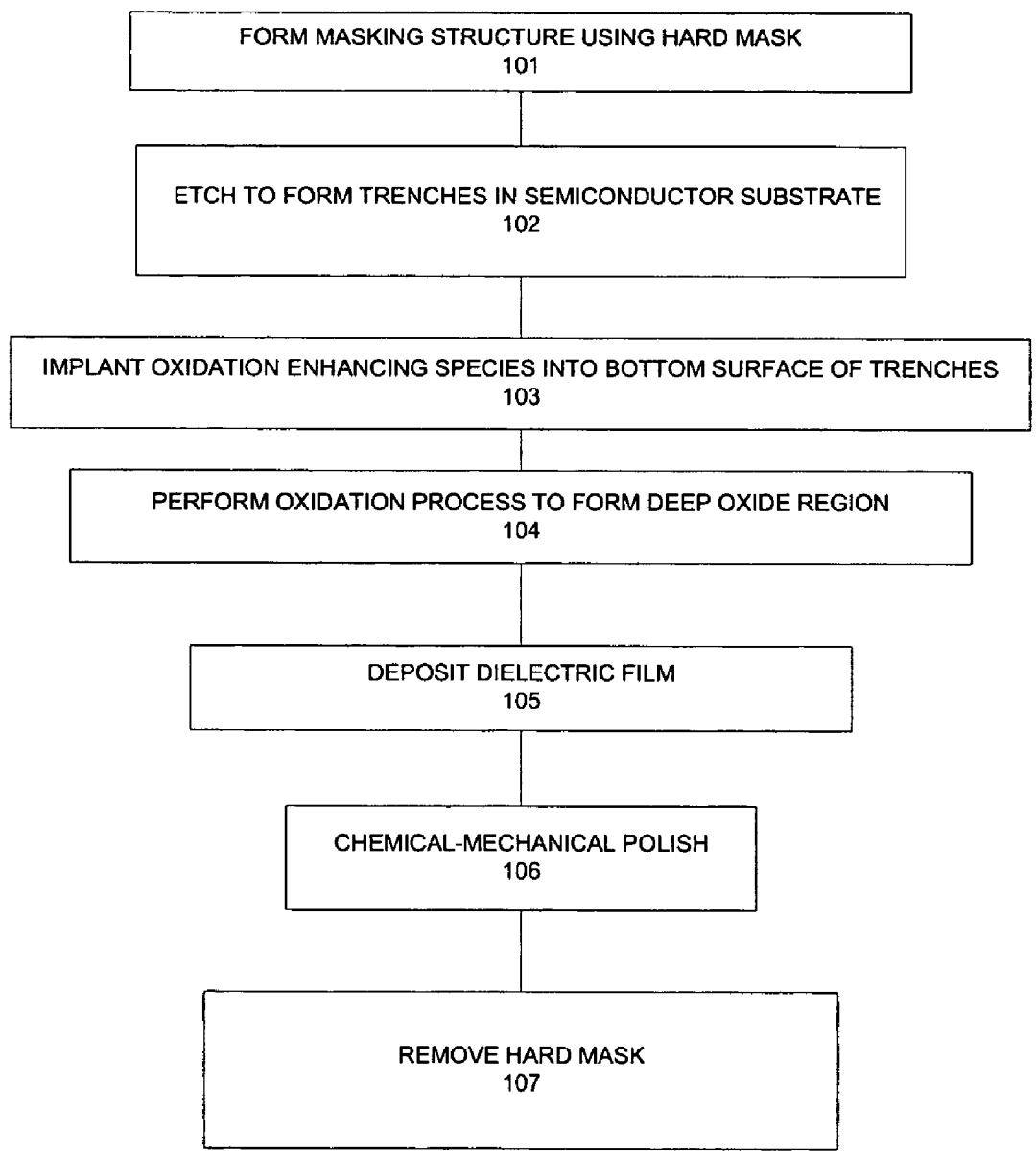
FIG. 1 is a flow chart that illustrates a method 100 for forming a shallow trench isolation structure on a semiconductor substrate in accordance with one embodiment of the present invention.

FIG. 1 illustrates a method 100 for forming a shallow trench isolation structure on a semiconductor substrate. As shown by step 101 a masking structure is formed over a semiconductor substrate. In the present embodiment the masking structure includes a hard mask. Openings that extend through the hardmask define the location of shallow trenches.

Figure 2:
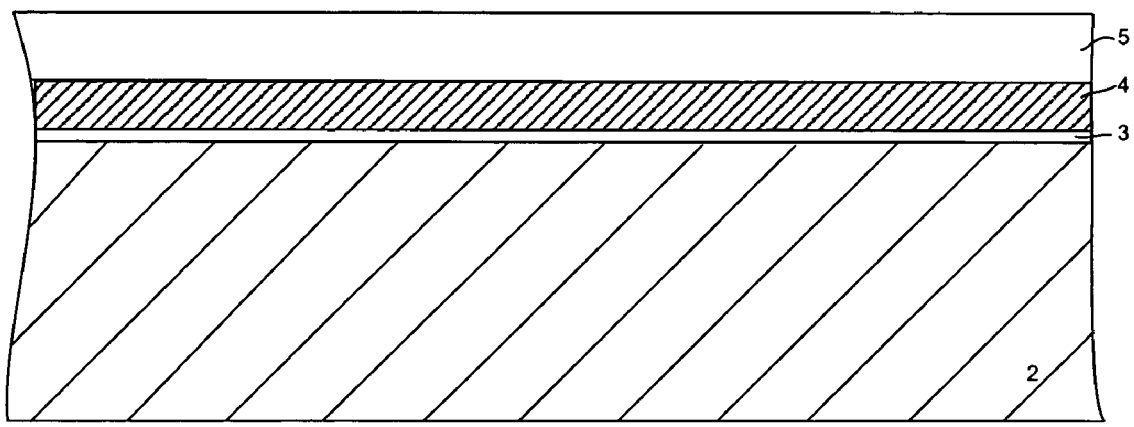
FIG. 2 is a side cross-sectional view of a portion of a semiconductor substrate over which an oxide layer, hard mask and a layer of photoresist have been deposited in accordance with one embodiment of the present invention.
Figure 3:
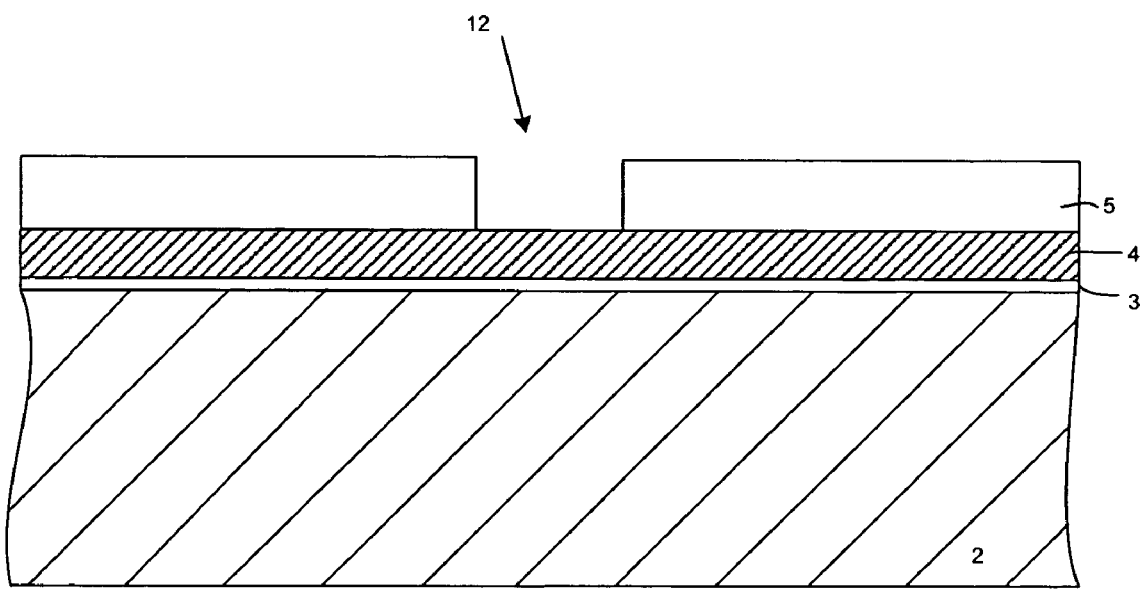
FIG. 3 is a side cross-sectional view of the structure of FIG. 2 after the layer of resist has been patterned and developed in accordance with one embodiment of the present invention.
Figure 4:
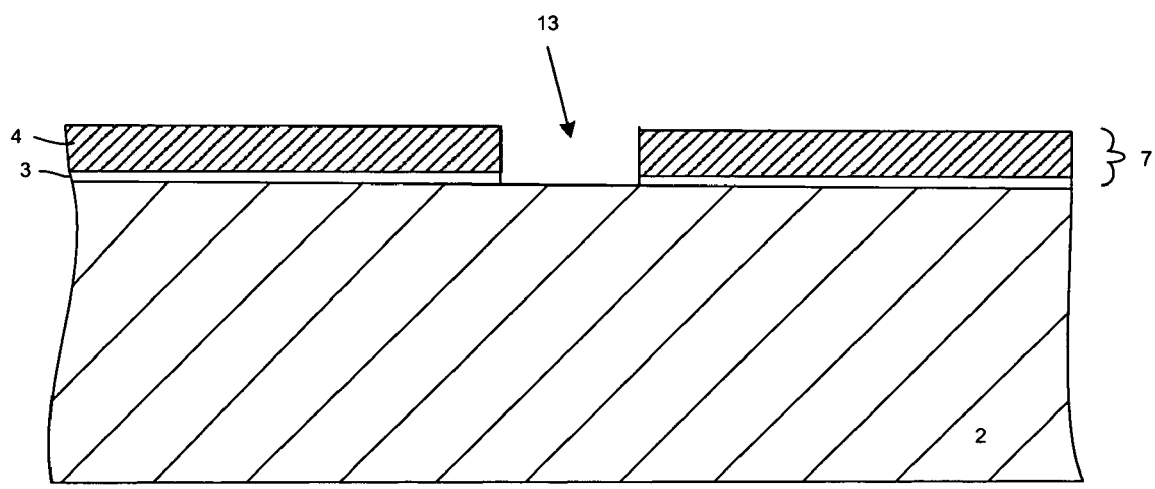
FIG. 4 is a side cross-sectional view of the structure of FIG. 3 after an etch step has been performed so as to etch through the hard mask and the oxide layer, and after remaining resist has been removed in accordance with one embodiment of the present invention.

FIGS. 2–4 illustrate the formation of a masking structure 7 that includes an oxide layer 3 and an overlying hard mask 4. First, an oxide layer 3 is grown or deposited on semiconductor substrate 2. In the present embodiment oxide layer 3 has a thickness of from 50 to 200 Angstroms. In one embodiment oxide layer 3 has a thickness of approximately 90 Angstroms and is formed immediately over the top surface of semiconductor substrate 2. Hard mask 4 is then formed such that it immediately overlies oxide layer 3. Hard mask 4 can be a silicon nitride ($Si_3N_4$) film that is formed by depositing silicon nitride in a furnace using a Low Pressure Chemical Vapor Deposition (LPCVD) process. In one embodiment hard mask 4 is a single layer of silicon nitride that has a thickness of from 1,000 to 1,500 Angstroms.

Referring now to FIGS. 2–3, hard mask 4 is patterned by depositing a photoresist layer 5 that is exposed and developed to form opening 12. Opening 12 defines isolation regions in semiconductor substrate 2 by extending around those portions of the substrate where isolation regions are to be formed. Hard mask 4 is patterned using an etch process that etches through both hard mask 4 and oxide layer 3. Photoresist layer 5 is then stripped, giving masking structure 7 that is shown in FIG. 4. Opening 13 which extends through both silicon nitride film 4 and oxide layer 3 exposes a portion of the top surface of semiconductor substrate 2.

Though masking structure 7 of the present invention is formed using a layer of silicon nitride hard mask, it is appreciated that other materials and processes could be used to form a masking structure that exposes portions of the semiconductor substrate 2 to define regions that are to be to etched to form shallow trench isolation structures. In one embodiment a masking structure is formed using one or more layers, with individual layers formed of silicon nitride, silicon oxynitride or any other material that can be used as an etch stop in a chemical-mechanical polishing process.

As shown by step 102 an etch is performed so as to form trenches within the semiconductor substrate. In the present embodiment a highly directional dry etch process is used that etches the semiconductor substrate vertically. In one embodiment etch 102 is a reactive ion etch that has a high selectivity between silicon and silicon nitride such that silicon substrate 2 is preferentially etched.

In one exemplary embodiment an etch chemistry is used that includes carbon tetraflouride ($CF_4$), hydrogen Bromide (HBr), Chlorine ($Cl_2$), helium (He), and oxygen ($O_2$). In this embodiment the reactive ion etch is performed at a pressure of from 50 to 70 milliTorr and at a power of from 600 to 800 Watts.

Figure 5:
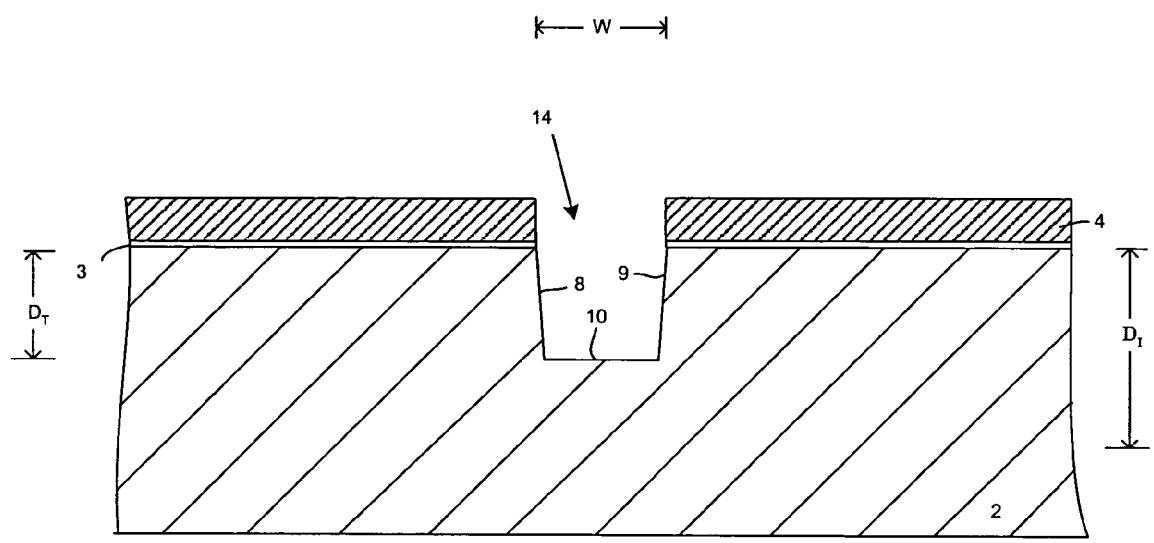
FIG. 5 is a side cross-sectional view of the structure of FIG. 4 after an etch step has been performed so as to form a trench that extends within the semiconductor substrate in accordance with one embodiment of the present invention.

FIG. 5 shows a trench 14 formed in accordance with method 100 that is bounded by side surface 8–9 and bottom surface 10 of semiconductor substrate 2. Side surfaces 8–9 extend on opposite sides of trench 14. In the present embodiment side surfaces 8–9 extend at an angle of approximately 87 degrees relative to bottom surface 10.

Referring now to step 103 an oxidation enhancing species is implanted into the bottom surface of each trench. The term "oxidation enhancing species" includes any species that, when implanted into a semiconductor substrate, promotes the formation of a silicon oxide (SiO) within the substrate, when the substrate is heated. In one embodiment oxygen is used as an oxidation enhancing species. In this embodiment oxygen is implanted so as to form an oxygenated region that extends below the bottom surface of each trench. Alternatively, fluorine can be used as an oxidation enhancing species.

Figure 6:
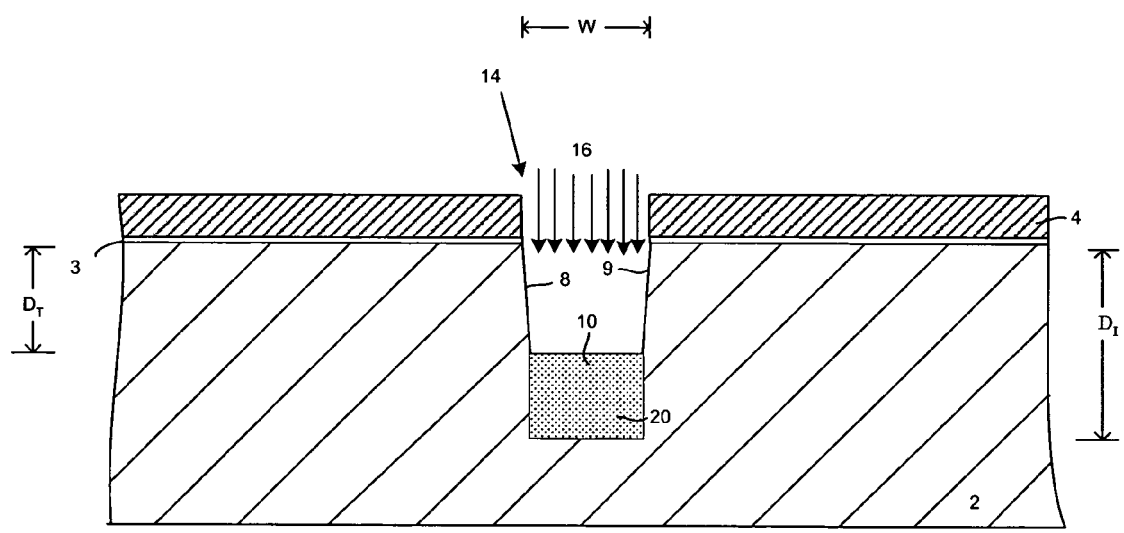
FIG. 6 is a side cross-sectional view of the structure of FIG. 5 after an oxidation enhancing species has been implanted into the bottom surface of the trench in accordance with one embodiment of the present invention.

In the embodiment shown in FIG. 6, oxidation enhancing species 16 is implanted so as to form oxidation enhancing implant region 20 that extends below bottom surface 10. Though FIG. 6 only illustrates the implantation of species 30 into trench 14, the implantation process is a blanket implantation process, with hard mask 4 blocking implantation into the top surface of semiconductor substrate 2. Alternatively, the resist layer 5 that is used to pattern hard mask 4 is not removed until after implantation process 103 so that the resist layer 5 blocks implantation into hard mask 4, further protecting the top surface of semiconductor substrate 2. When oxygen is used as an oxidation enhancing species, implant region 20 will be an oxygenated region. Similarly, when fluorine is used as an oxidation enhancing species, implant region 20 will be a fluorinated region. In the present embodiment implant region 20 extends from bottom surface 10 to the isolation depth $D_I$. However, alternatively, implant region 20 can extend near isolation depth $D_I$ or can exceed $D_I$. In one embodiment implant region 20 extends slightly deeper than $D_I$ so as to assure that the desired isolation parameters will be met.

In one embodiment oxygen is implanted using an implant energy of from 100 KeV to 230 KeV and a dose of from 1E17 to 1E18 cm−2 using an oxygen implanter. However, it is appreciated that different doses and implant energies can be used, depending on the oxidation enhancing species used and the desired oxidation characteristics.

As shown by step 104 of FIG. 1 an oxidation process is performed. In the present embodiment the structure shown in FIG. 6 is heated in a furnace, in an oxygen rich ambient, to a temperature of from 900 degrees Centigrade to 1200 degrees Centigrade. In one embodiment the oxidation process is performed at a temperature of 1,000 degrees Centigrade for 20 minutes in either oxygen gas ($O_2$) or in a wet anneal ($H_2O$) environment. However, it is appreciated that the parameters of the oxidation process will vary depending on the desired thickness of the deep oxide region and the characteristics of the oxygen enhancing region.

Figure 7:
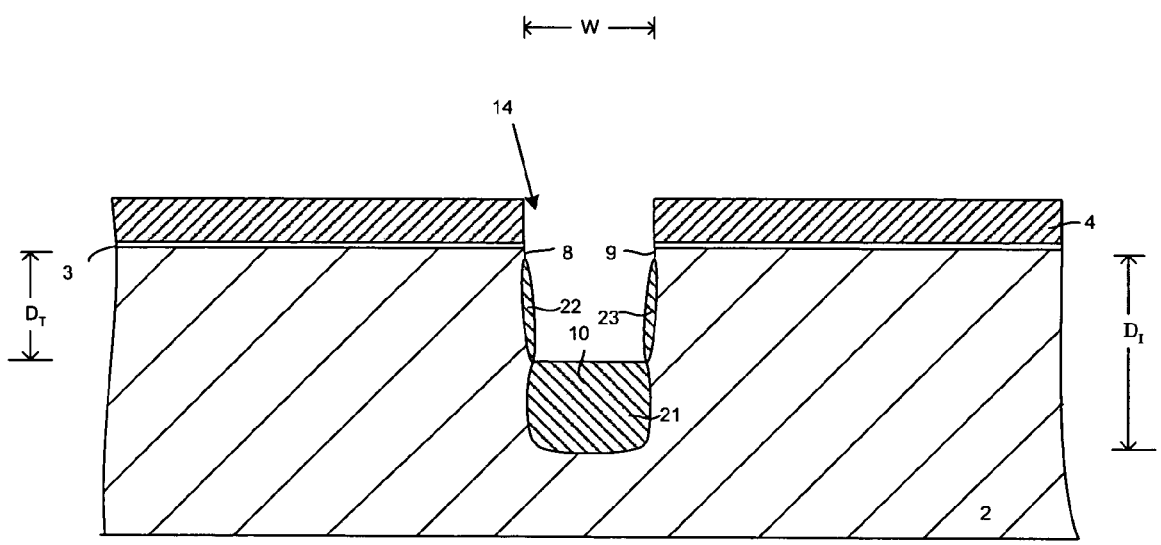
FIG. 7 is a side cross-sectional view of the structure of FIG. 6 after an oxidation process has been performed so as to form a deep oxidation region that extends below the bottom surface of the trench in accordance with one embodiment of the present invention.

FIG. 7 shows the structure of FIG. 6 after an oxidation process has been performed so as to form deep oxide region 21 that extends below bottom surface 10 of semiconductor substrate 2. In addition, the oxidation process forms oxide regions 22–23 that extend within side surfaces 8–9 of semiconductor substrate 2. The oxidation enhancing species within oxidation enhancing regions 20 will cause oxide to grow much more quickly below bottom surface 10 than within either of side surfaces 8–9. This results in a deep oxide region 21 that is significantly thicker than oxide regions 22–23 that extend within side surfaces 8–9. In the present embodiment the oxidation process of step 104 forms a deep oxide region 21 that extends from bottom surface 10 to the isolation depth $D_I$. However, alternatively, deep oxide region 21 can extend below $D_I$. In the present embodiment deep oxide region 21 extends slightly deeper than $D_I$ so as to assure that the desired isolation parameters will be met.

Oxide regions 22–23 are significantly thinner than deep oxide region 21. In one embodiment the thickness of deep oxide region 21 is more than five times the thickness of oxide regions 22–23. In the present embodiment deep oxide region 21 is more than ten times the thickness of oxide regions 22–23. As oxide regions 22–23 are thin, they do not consume much of the valuable surface area within active areas, leaving most of the surface of active areas for forming devices.

In one specific embodiment in which the isolation depth is 5,000 Angstroms, trench 14 has a depth of approximately 2,500 Angstroms and a deep oxide region 21 is formed that has a thickness of approximately 2,500 Angstroms. In this embodiment oxide regions 22–23 are formed that have a thickness of approximately 200 Angstroms.

As shown by step 105 a dielectric film is deposited that fills the trench. In one embodiment the dielectric film is a single layer of dielectric film. The dielectric film can be a High Density Plasma (HDP) oxide that is deposited using a Plasma Enhanced Chemical Vapor Deposition (PECVD) process. In another embodiment the dielectric film is ozone Tetraethyl Orthosilicate (TEOS), that can also be referred to as Undoped Silicate Glass (USG), or Non-doped Silicate Glass (NSG). In another embodiment the dielectric film is spin-on dielectric such as Spin-On-Glass (SOG). However, dielectric film can also be formed using multiple layers of material and can be formed using any of a number of other materials that have good dielectric properties.

Figure 8:
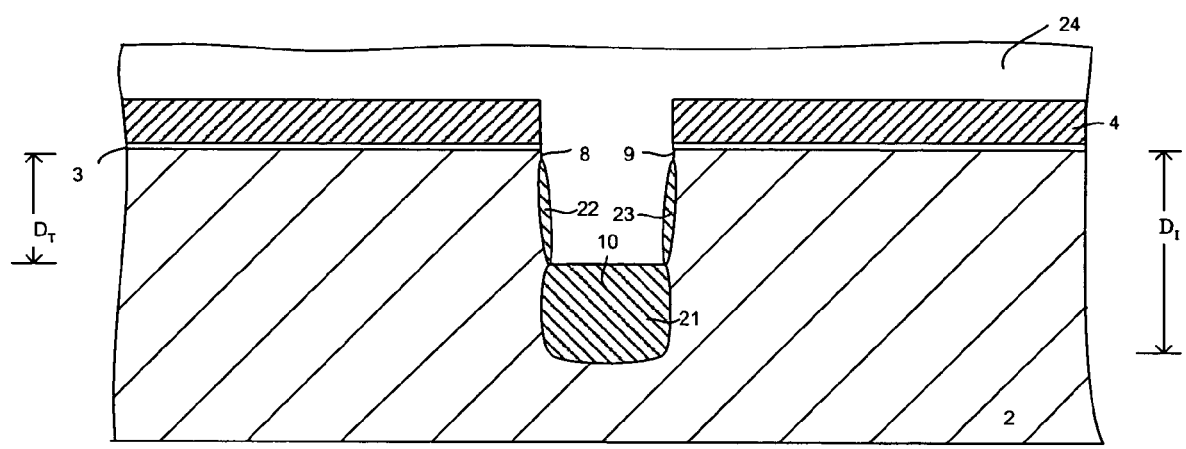
FIG. 8 is a side cross-sectional view of the structure of FIG. 7 after a dielectric film has been deposited such that the dielectric film fills the trench and partially overlies the hardmask in accordance with one embodiment of the present invention.

In the embodiment shown in FIG. 8 a dielectric film 24 is shown to be deposited such that deposited dielectric film 24 fills trench 14, with a portion of deposited dielectric film 24 extending over the top surface of hard mask 4. Dielectric film 24 immediately overlies deep oxide region 21 and directly adjoins oxide regions 22–23.

Figure 9:
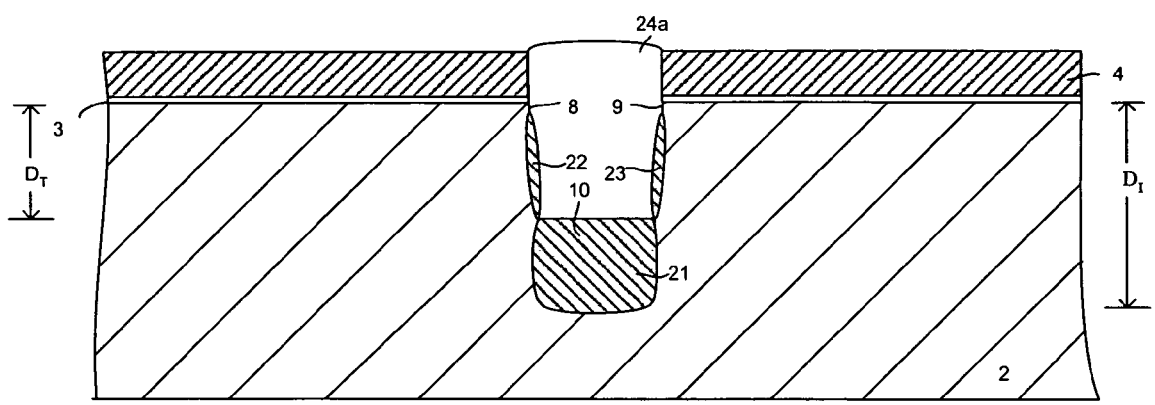
FIG. 9 is a side cross-sectional view of the structure of FIG. 8 after a chemical mechanical polishing process has been performed in accordance with one embodiment of the present invention.

As shown by step 106 a chemical-mechanical polishing process is performed. In the present embodiment, the chemical-mechanical polishing process removes those portions of deposited dielectric layer 24 that overlie hard mask 4 so as to form dielectric plug 24a shown in FIG. 9. In the present embodiment hard mask 4 is used as an etch stop for the chemical-mechanical polishing process, planarizing the top surface such that the top surface of plug 24a is approximately coplanar with the top surface of hard mask 4.

Figure 10:
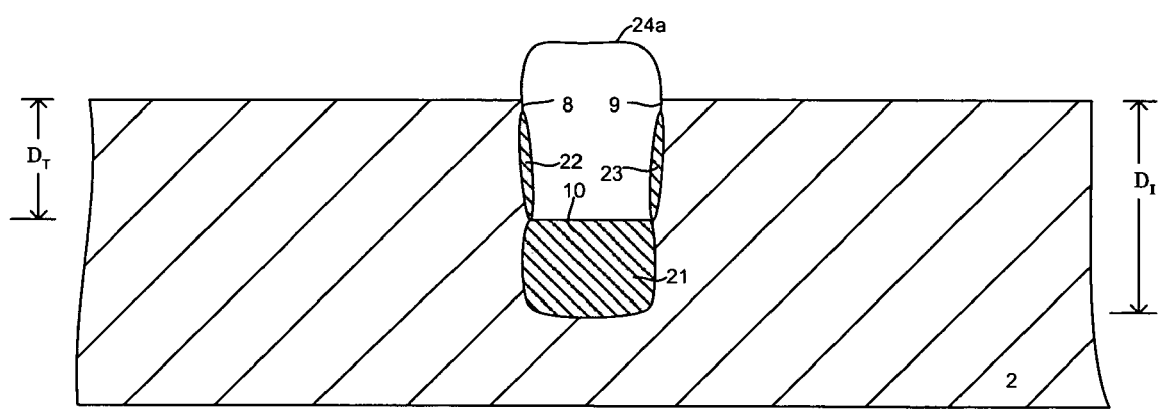
FIG. 10 is a side cross-sectional view of the structure of FIG. 9 after remaining hard mask has been removed in accordance with one embodiment of the present invention.

As shown by step 107 the remaining hard mask is removed. In one embodiment a HF clean process is performed immediately prior to removal of the hard mask to clean the surface of the hard mask. When hard mask 4 is a silicon nitride film it can be removed using a hot phosphoric acid ($H_3PO_4$) strip to obtain the structure shown in FIG. 10. Alternatively, other processes can be used to remove hard mask 4 such as, for example, dry etch processes or other wet etch processes, depending on the material that is used to form hard mask 4.

Figure 11:
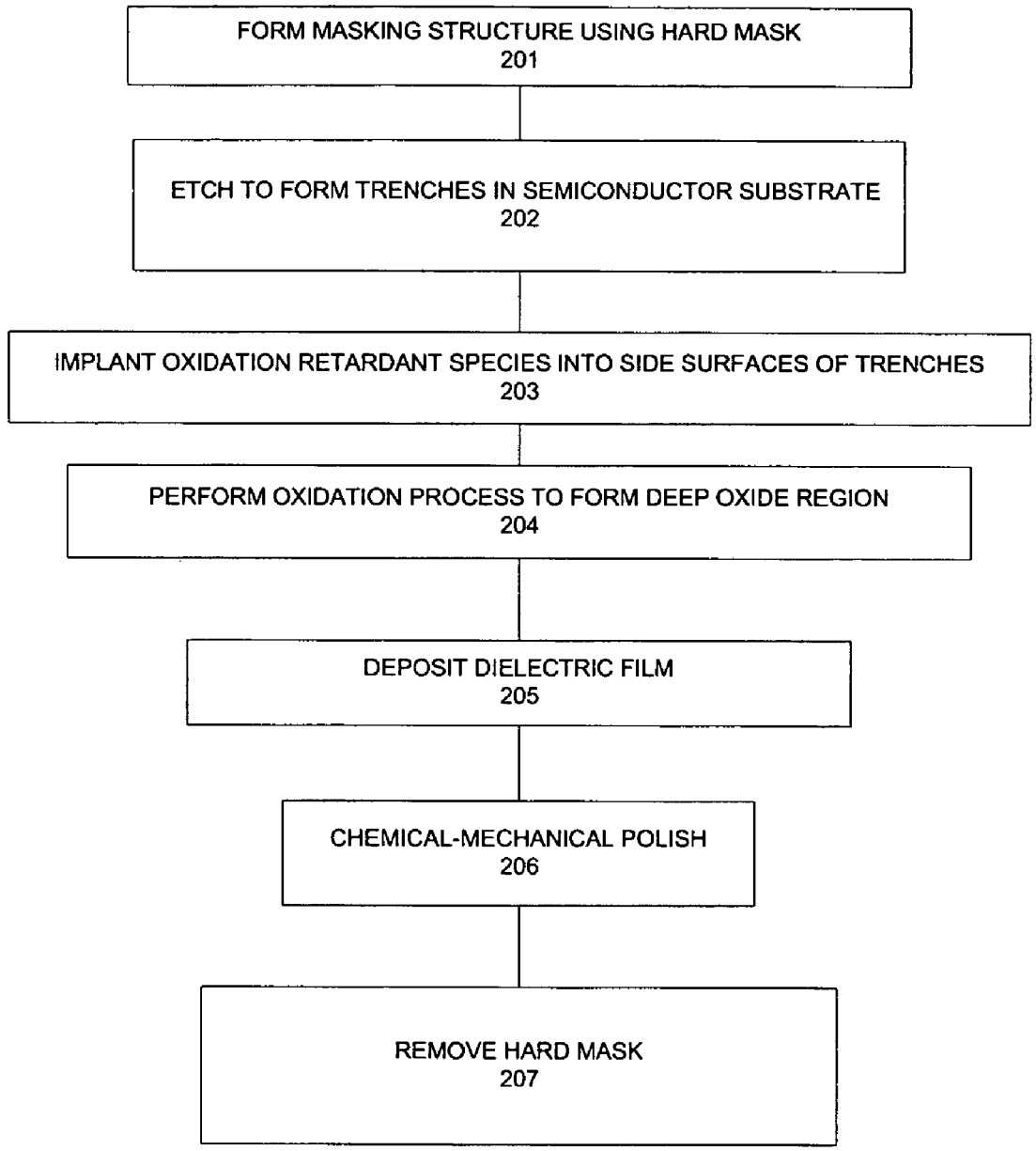
FIG. 11 is a flow chart that illustrates a method 200 for forming a shallow trench isolation structure on a semiconductor substrate in accordance with one embodiment of the present invention.

FIG. 11 illustrates a method 200 for forming a shallow trench isolation structure in which oxidation retardant species are implanted into side surfaces of each trench. A masking structure is formed using a hard mask (step 201) and an etch process is performed to form trenches in the semiconductor substrate (step 202). In the present embodiment steps 201–102 are performed in the same manner as shown in FIGS. 1–5, forming trench 14 shown in FIG. 5.

Oxidation retardant species are then implanted into the side surfaces of the trenches as shown by step 203. The term "oxidation retardant species" includes any species that, when implanted into a semiconductor substrate, inhibits the formation of a silicon oxide (SiO) within the substrate, when the substrate is heated. In one embodiment nitrogen is used as an oxidation retardant species. In this embodiment nitrogen is implanted at an angle so as to form a nitrogen rich region that extends within each side surface of each trench. In one specific embodiment nitrogen is implanted using an implant energy of from 20 KeV to 50 KeV and a dose of from 1E14 to 1E18 cm−2. However, it is appreciated that different doses and implant energies can be used, depending on the oxidation retardant species used and the desired oxidation characteristics.

Figure 12:
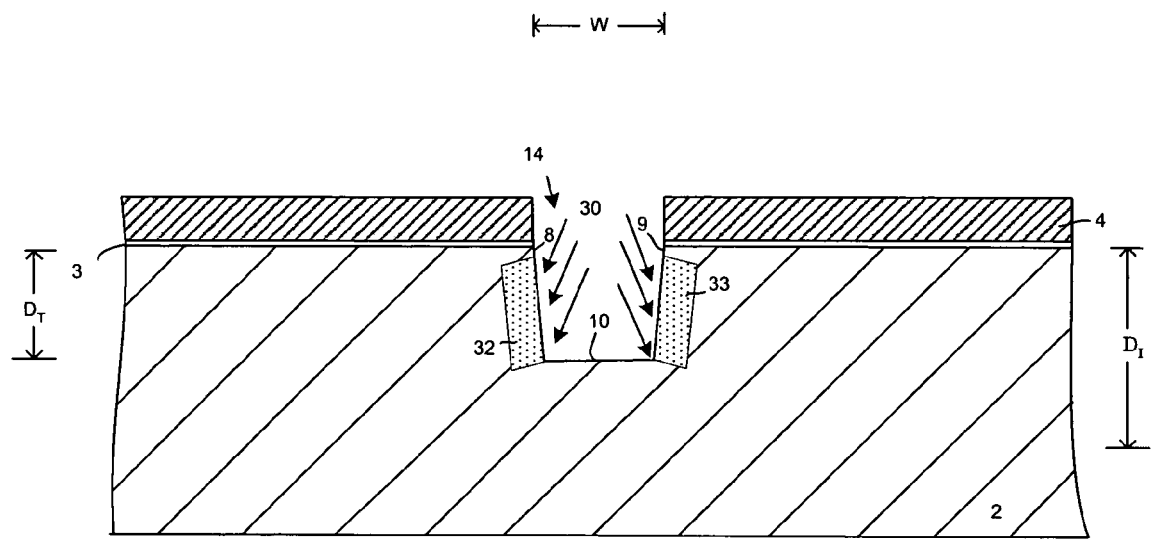
FIG. 12 is a side cross-sectional view of the structure of FIG. 5 and illustrates implantation of an oxidation retardant species into side surfaces of the trench in accordance with one embodiment of the present invention.

In the embodiment shown in FIG. 12, oxidation retardant species 30 are shown to be implanted into side surfaces 8–9 so as to form oxidation retardant implant regions 32–33. Though FIG. 12 only illustrates the implantation of species 30 into trench 14, the implantation process is a blanket implantation process, with hard mask 4 blocking implantation into the top surface of semiconductor substrate 2. Oxidation retardant implant region 32–33 extend within side surfaces 8–9 to a depth sufficient to significantly inhibit growth of oxide in the subsequent oxidation process. In one embodiment oxidation retardant implant regions 32–33 extend to a depth in excess of 200 Angstroms within side surfaces 8–9.

In addition to inhibiting oxidation, when nitrogen is used as an oxidation retardant species to form nitrogen-rich implant regions 32–33, the nitrogen-rich implant regions 32–33 can serve as a boron diffusion inhibitor, giving good threshold voltage (Vth) control, and less sensitivity to device dimension. Also, nitrogen-rich implant regions 32–33 will inhibit additional oxidation in trench surfaces 8–9 that can occur in the subsequent gate oxide growth process. In addition, shallow trench isolation-trench induced stress/volume expansion and stress built-up is reduced, preventing stress-related dislocations.

As shown by step 204 of FIG. 11 an oxidation process is performed. In the present embodiment the structure shown in FIG. 12 is heated in a furnace, in an oxygen rich ambient, to a temperature of between 900 degrees Centigrade and 1200 degrees Centigrade. In one specific embodiment the oxidation process is performed at a temperature of 1,200 degrees Centigrade for 40 minutes in either oxygen gas ($O_2$) or in a wet anneal ($H_2O$) environment. However, it is appreciated that the parameters of the oxidation process will vary depending on the desired thickness of the deep oxide region and the characteristics of the oxygen retardant region.

Figure 13:
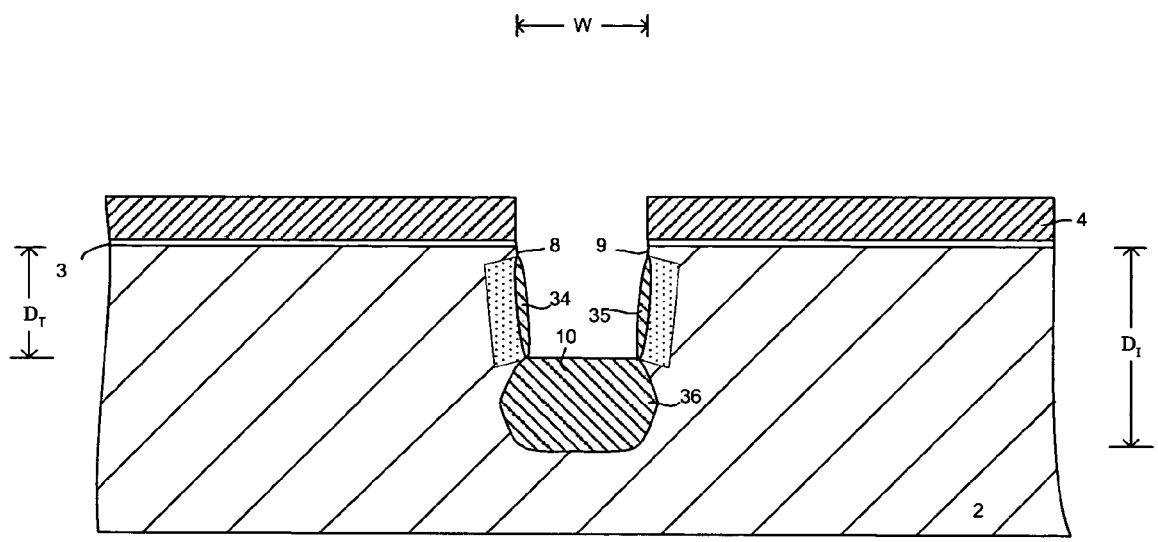
FIG. 13 is a side cross-sectional view of the structure of FIG. 11 after an oxidation process has been performed so as to form a deep oxidation region that extends below the bottom surface of the trench in accordance with one embodiment of the present invention.

The oxidation process forms deep oxide region 36, shown in FIG. 13, that extends below bottom surface 10 of semiconductor substrate 2. In addition, the oxidation process forms oxide regions 34–35 that extend within side surfaces 8–9 of semiconductor substrate 2.

Oxidation retardant species 30 inhibit growth of oxide during oxidation process 204, resulting in very little oxide being formed within side surfaces 8–9, producing oxide regions 34–35 that are thin. In contrast, deep oxide region 36 is much thicker, extending down to, or past, isolation depth $D_I$. In the present embodiment the oxidation process of step 204 forms a deep oxide region 36 that extends from bottom surface 10 to the isolation depth $D_I$. However, alternatively, deep oxide region 36 can extend below $D_I$. In the present embodiment deep oxide region 36 extends slightly deeper than $D_I$ so as to assure that the desired isolation parameters will be met.

Oxide regions 34–35 are significantly thinner than deep oxide region 36. In one embodiment deep oxide region 36 is more than five times the thickness of oxide regions 34–35. In the present embodiment deep oxide region 36 is more than ten times the thickness of oxide regions 34–35. As oxide regions 34–35 are thin, they do not consume much of the valuable surface area within active areas, leaving most of the surface of active areas for forming devices.

In one specific embodiment in which the isolation depth is 5,000 Angstroms, trench 14 has a depth of approximately 2,500 Angstroms and a deep oxide region 36 is formed that has a thickness of approximately 2,500 Angstroms. In this embodiment oxide regions 34–35 are formed that have a thickness of approximately 200 Angstroms.

The process is then continued in the same manner as shown in steps 105–107 of FIG. 1, by depositing a dielectric film (step 205), performing a chemical-mechanical polishing process (step 206), and removing the hard mask (step 207).

Figure 14:
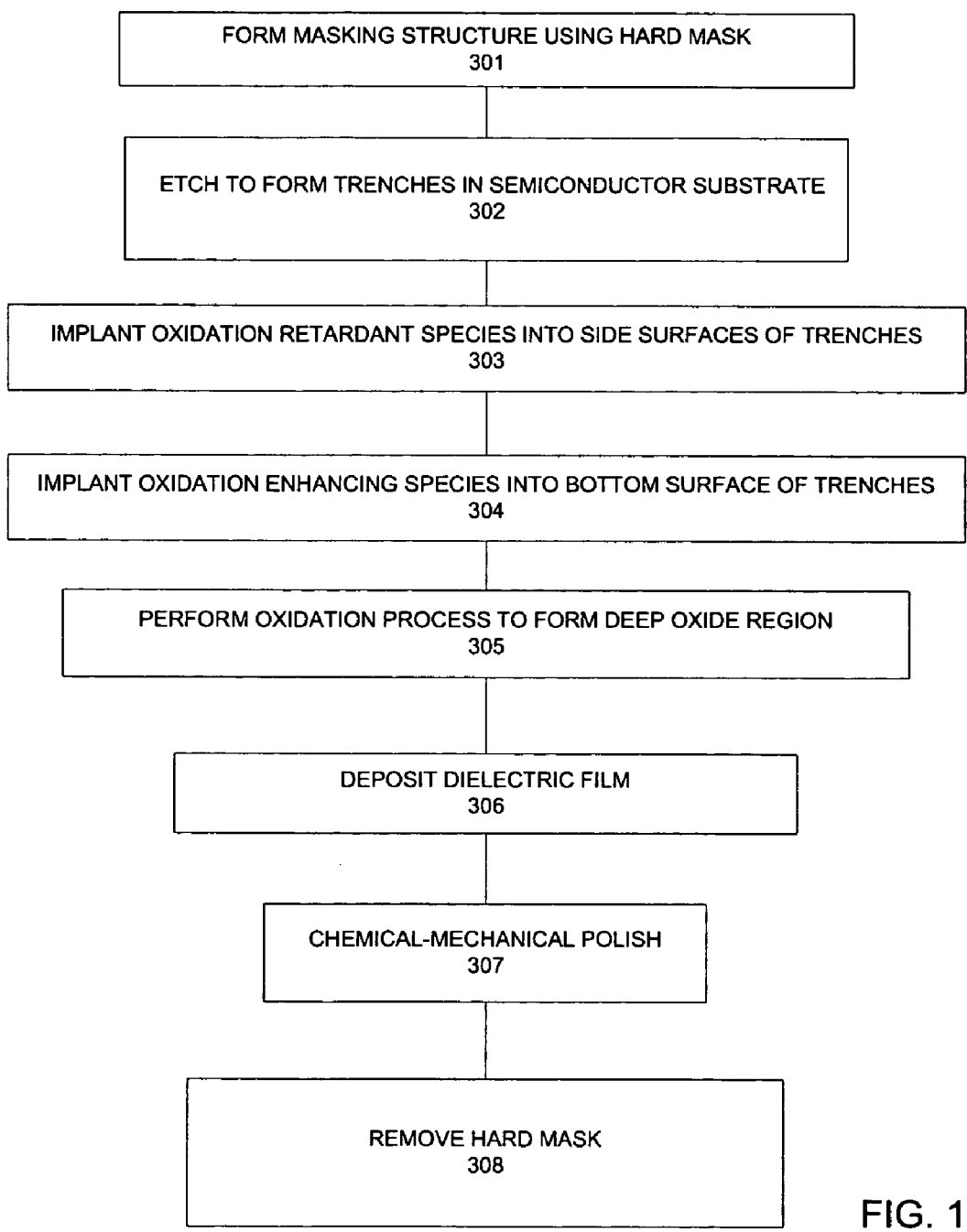
FIG. 14 is a flow chart that illustrates a method 300 for forming a shallow trench isolation structure on a semiconductor substrate in accordance with one embodiment of the present invention.

FIG. 14 illustrates a method 300 for forming a shallow trench isolation structure in which oxidation retardant species are implanted into side surfaces of each trench and in which oxidation enhancing species are implanted into the bottom surface of the trenches. First, a masking structure is formed using a hard mask (step 301) and an etch process is performed to form trenches in the semiconductor substrate (step 302). In the present embodiment steps 301–302 are performed in the same manner as shown in FIGS. 1–5, forming trench 14 shown in FIG. 5.

Oxidation retardant species are then implanted into the side surfaces of the trenches as shown by step 303. In the present embodiment nitrogen ($N_2$) nitrogen is implanted into the side surfaces of the trench at an angle so as to form nitrogen rich regions that extend within each side surface of each trench.

Figure 15:
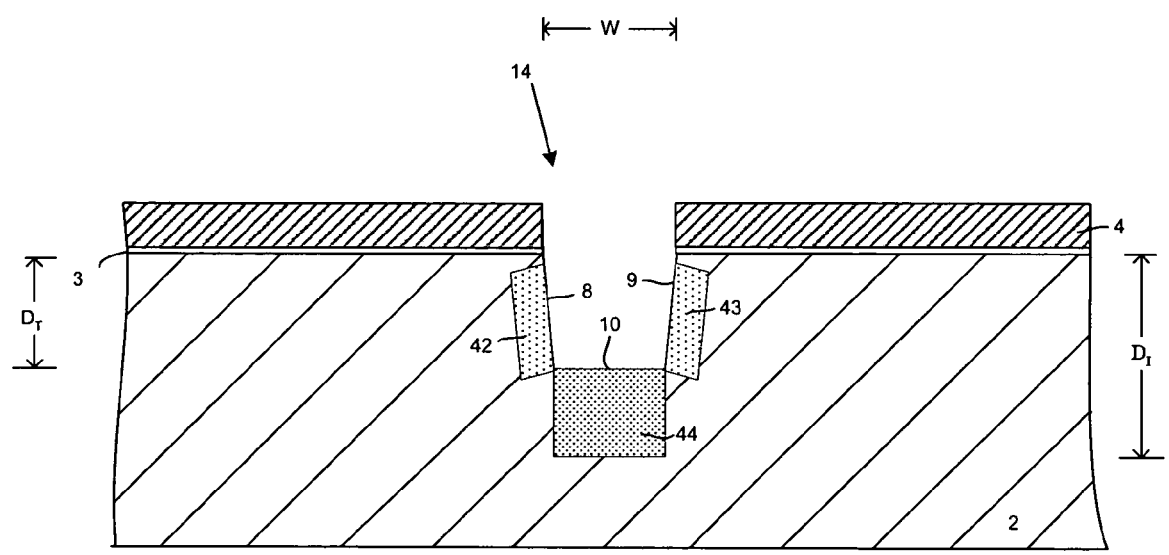
FIG. 15 is a side cross-sectional view of the structure of FIG. 5 after an oxidation retardant species has been implanted into side surfaces of the trench, and after an oxidation enhancing species has been implanted into the bottom surface of the trench in accordance with one embodiment of the present invention.

In the embodiment shown in FIG. 15, oxidation retardant species are shown to be implanted into side surfaces 8–9 so as to form oxidation retardant implant regions 42–43. Oxidation retardant implant regions 42–43 extend within side surfaces 8–9 to a depth sufficient to significantly inhibit growth of oxide in the subsequent oxidation process.

Referring now to step 304 an oxidation enhancing species is implanted into the bottom surface of each trench. In the embodiment shown in FIG. 15, the implantation of oxidation enhancing species forms oxidation enhancing implant region 44 that extends below bottom surface 10. In the present embodiment oxygen ($O_2$) is implanted such that implant region 44 is an oxygenated region. Alternatively, fluorine ($F_2$) or any other oxidation enhancing species can be implanted so as to form oxidation enhancing implant region 44. In the present embodiment implant region 44 extends from bottom surface 10 to isolation depth $D_I$. However, alternatively, the depth of implant region 44 can exceed $D_I$. In one embodiment implant region 44 extends slightly deeper than $D_I$ so as to assure that the desired isolation parameters will be met.

As shown by step 305 an oxidation process is performed. In the present embodiment the structure shown in FIG. 15 is heated in a furnace, in an oxygen rich ambient, to a temperature of between 900 degrees Centigrade and 1200 degrees Centigrade. In one specific embodiment the oxidation process is performed at a temperature of 1,100 degrees Centigrade for 20 minutes in either oxygen gas ($O_2$) or in a wet anneal ($H_2O$) environment. However, it is appreciated that the parameters of the oxidation process will vary depending on the desired thickness of the deep oxide region, and the characteristics of the oxygen retardant implant regions, and the oxygen enhancing implant region.

Figure 16:
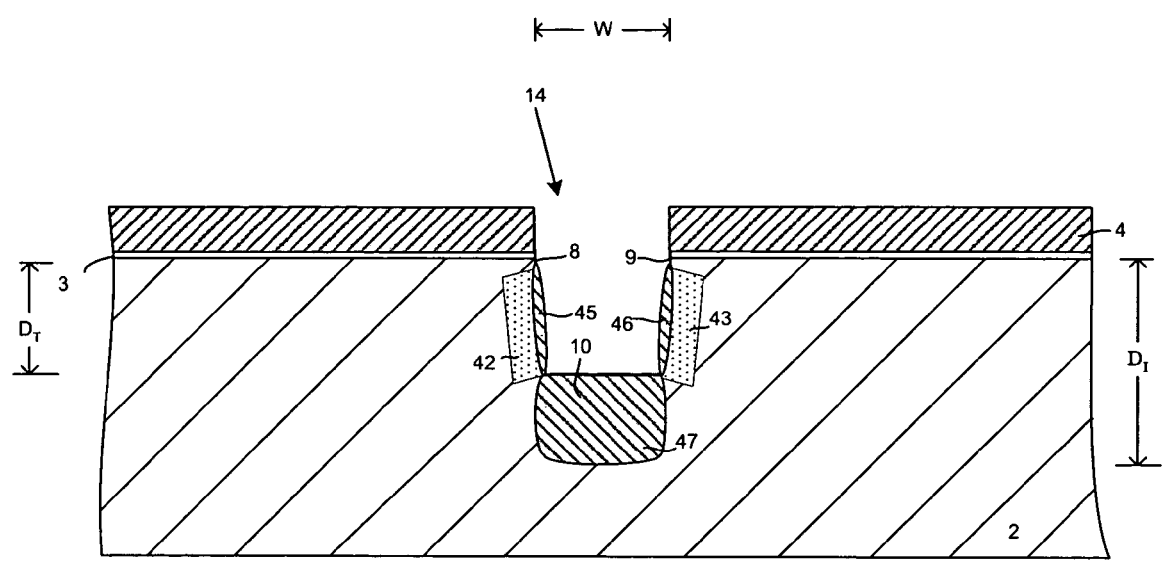
FIG. 16 is a side cross-sectional view of the structure of FIG. 15 after an oxidation process has been performed so as to form a deep oxidation region that extends below the bottom surface of the trench in accordance with one embodiment of the present invention.

Oxidation retardant species 30 inhibit growth of oxide during oxidation process 305, resulting in very little oxide being formed within side surfaces 8–9, producing oxide regions 45–46, shown in FIG. 16, that are thin. Moreover, the oxidation enhancing species within oxidation enhancing region 44 will cause oxide to grow much more quickly below bottom surface 10, producing a deep oxide region 47 that is much thicker than oxide regions 45–46. In the present embodiment the oxidation process of step 305 forms a deep oxide region 47 that extends from bottom surface 10 to the isolation depth $D_I$. However, alternatively, deep oxide region 47 can extend below $D_I$. In the present embodiment deep oxide region 47 extends slightly deeper than $D_I$ so as to assure that the desired isolation parameters will be met.

In one specific embodiment in which the isolation depth is 5,000 Angstroms, trench 14 has a depth of approximately 2,500 Angstroms and a deep oxide region 47 is formed that has a thickness of approximately 2,500 Angstroms. In this embodiment oxide regions 45–46 are formed that have a thickness of approximately 200 Angstroms.

The process is then continued in the same manner as shown in steps 105–107 of FIG. 1, by depositing a dielectric film (step 306), performing a chemical-mechanical polishing process (step 307), and removing the hard mask (step 308) to form a completed shallow trench isolation structure.

Methods 100, 200 and 300 of the present invention allow for the use of trenches that are shallower than the trenches that are used in conventional processes for achieving a given isolation depth. In one embodiment the methods 100, 200 and 300 are performed so as to form trenches that have a depth that is less than or equal to half of the required isolation depth. In another embodiment methods 100, 200 and 300 are performed so as to form trenches that have a depth that is less than or equal to sixty percent of the required isolation depth. In yet another embodiment methods 100, 200 and 300 are performed so as to form trenches that have a depth that is less than or equal to eighty percent of the required isolation depth. In these embodiments the deep oxide region will be formed that extends from the bottom of the trenches to a depth greater than or equal to the required isolation depth. Accordingly, when the trench has a depth that is sixty percent or less of the isolation depth, the deep oxide region will have a thickness that is forty percent or more of the required isolation depth. When the trench has a depth that is fifty percent or less of the isolation depth, the deep oxide region will have a thickness that is fifty percent or more of the required isolation depth. Similarly, when the trench has a depth that is eighty percent or less of the isolation depth, the deep oxide region will have a thickness that is twenty percent or more of the required isolation depth.

Methods 100, 200 and 300 of the present invention allow for the use of trenches that are shallower than the trenches that are used in conventional processes for achieving a given isolation depth. As the trench is shallower than conventional trenches for obtaining a particular isolation depth, the problems of void formation are avoided. This eliminates the problems of void formation and bridging that can result from the use of narrow trenches. Accordingly, the methods and apparatus of the present invention allow for the use of narrow trenches while adequately preventing current leakage. In addition, as the methods of the present invention only form a thin oxide under side surfaces of trenches, a shallow trench isolation structure results that has thin sidewall oxidation regions. As these oxidation regions are thin, they do not consume much of the valuable surface area within active areas, leaving most of the surface of active areas for forming devices.

The preferred embodiment of the present invention is thus described. While the present invention has been described in particular embodiments, it should be appreciated that the present invention should not be construed as limited by such embodiments, but rather construed according to the following claims.

What is claimed is:

1. A method for forming a shallow trench isolation structure comprising:
   forming a trench within a semiconductor substrate, said trench having a bottom surface and having side surfaces that extend on each side of said bottom surface;
   implanting an oxidation retardant species into said side surfaces of said trench;
   implanting an oxidation enhancing species into said bottom surface of said trench; and
   performing an oxidation process so as to form oxidation regions within said side surfaces of said trench and form a deep oxidation region below said bottom surface of said trench, said deep oxidation region having a thickness that is greater than the thickness of said oxidation regions within said side surfaces of said trench.

2. A method as recited in claim 1 wherein said oxidation enhancing species further comprises oxygen.

3. A method as recited in claim 1 wherein said oxidation enhancing species further comprises fluorine.

4. A method as recited in claim 1 further comprising:
   depositing a dielectric film such that said deposited dielectric film fills said trench; and
   performing a chemical-mechanical polishing process.

5. A method as recited in claim 4 wherein said forming a trench further comprises:
   forming an oxide layer on said semiconductor substrate;
   depositing a hard mask over said oxide layer such that said hard mask immediately overlies said oxide layer;
   patterning said hard mask so as to form an opening that extends through said hard mask; and
   performing an etch process so as to form a trench within said semiconductor substrate.

6. A method for forming a shallow trench isolation structure comprising:
   forming a trench within a semiconductor substrate, said trench having a bottom surface and having side surfaces that extend on each side of said bottom surface;
   implanting an oxidation retardant species into said side surfaces of said trench; and
   performing an oxidation process, after said implanting an oxidation retardant species, so as to form oxidation regions within said side surfaces of said trench and form a deep oxidation region below said bottom surface of said trench, said oxidation retardant species inhibiting oxidation of said side surfaces of said trench so as to form a deep oxidation region having a thickness that is greater than the thickness of said oxidation regions within said side surfaces of said trench.

7. A method as recited in claim 6 wherein said oxidation retardant species further comprises nitrogen.

8. A method as recited in claim 6 further comprising implanting an oxidation enhancing species into said bottom surface of said trench prior to performing said oxidation process.

9. A method as recited in claim 8 wherein said oxidation enhancing species further comprises oxygen.

10. A method as recited in claim 8 wherein said oxidation enhancing species further comprises fluorine.

11. A method as recited in claim 6 further comprising:
    depositing a dielectric film such that said deposited dielectric film fills said trench; and
    performing a chemical-mechanical polishing process.

12. A method as recited in claim 11 wherein said forming a trench further comprises:
    forming an oxide layer on said semiconductor substrate;
    depositing a hard mask over said oxide layer such that said hard mask immediately overlies said oxide layer;
    patterning said hard mask so as to form an opening that extends through said hard mask; and
    performing an etch process so as to form a trench within said semiconductor substrate.

13. A method for forming a shallow trench isolation structure comprising:
    forming a trench within a semiconductor substrate, said trench having a bottom surface and having side surfaces that extend on each side of said bottom surface;
    implanting nitrogen into said side surfaces of said trench; and
    implanting an oxidation enhancing species into said bottom surface of said trench;
    performing an oxidation process, after said implanting nitrogen and said implanting an oxidation enhancing species, so as to form oxidation regions within said side surfaces of said trench and form a deep oxidation region below said bottom surface of said trench, said nitrogen inhibiting oxidation of said side surfaces of said trench and said oxidation enhancing species enhancing oxidation in said bottom surface of said trench so as to form a deep oxidation region having a thickness that is greater than the thickness of said oxidation regions within said side surfaces of said trench.

14. A method as recited in claim 13 wherein said oxidation enhancing species further comprises oxygen.

15. A method as recited in claim 13 wherein said oxidation enhancing species further comprises fluorine.

* * * * *